(12) United States Patent
Lee

(10) Patent No.: US 7,964,952 B2
(45) Date of Patent: Jun. 21, 2011

(54) STACKED SEMICONDUCTOR PACKAGE ASSEMBLY HAVING HOLLOWED SUBSTRATE

(75) Inventor: Young Gue Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 1 day.

(21) Appl. No.: 12/409,489

(22) Filed: Mar. 24, 2009

(65) Prior Publication Data

US 2009/0179319 A1   Jul. 16, 2009

Related U.S. Application Data

(63) Continuation of application No. 11/420,873, filed on May 30, 2006, now Pat. No. 7,528,474.

(60) Provisional application No. 60/686,283, filed on May 31, 2005.

(51) Int. Cl.
*H01L 23/498* (2006.01)
*H01L 21/00* (2006.01)
*H01L 25/07* (2006.01)
*H01L 25/18* (2006.01)

(52) U.S. Cl. ......... 257/686; 257/E23.085; 257/E23.004; 257/E23.069; 257/E23.023; 257/E25.006; 257/698; 257/737; 257/685; 257/680; 257/773; 257/774; 257/778; 257/777; 257/E23.06

(58) Field of Classification Search .................. 257/686, 257/E23.085, E23.004, E23.069, E23.023, 257/E25.006, 698, 737, 738, 685, 680, 773, 257/774, 778, 777, E23.06; 438/109, 613
See application file for complete search history.

(56) References Cited

U.S. PATENT DOCUMENTS

| | | | |
|---|---|---|---|
| 4,996,587 A * | 2/1991 | Hinrichsmeyer et al. | ...... 257/676 |
| 5,578,525 A | 11/1996 | Mizukoshi | |
| 6,395,578 B1 | 5/2002 | Shin et al. | |
| 6,847,104 B2 | 1/2005 | Huang et al. | |
| 6,919,631 B1 | 7/2005 | Hoffman et al. | |
| 7,061,120 B2 | 6/2006 | Shin et al. | |
| 7,190,071 B2 | 3/2007 | Shin et al. | |
| 7,605,459 B2 * | 10/2009 | Mok et al. | ...................... 257/686 |
| 2004/0061211 A1 | 4/2004 | Michii et al. | |
| 2004/0125574 A1 | 7/2004 | Yoon | |
| 2004/0212068 A1 | 10/2004 | Wang | |

(Continued)

FOREIGN PATENT DOCUMENTS

JP  05-183103 A  *  7/1993

(Continued)

OTHER PUBLICATIONS

Office Action for Japanese Patent Application No. 2006-152548.

(Continued)

*Primary Examiner* — Alexander O Williams

(57) ABSTRACT

A stackable package substrate has an opening shaped and dimensioned to accommodate but not contact a mold cap of a package upon which the stackable package is to be mounted. On the die attach surface, the frame substrate accommodates a die attach margin adjacent at the edge of the opening; and a row of wire bond sites arranged along at an outer frame edge, for electrical interconnection. The frame substrate accommodates z-interconnect ball pads arranged to align with corresponding z-interconnect pads on the substrate of a package. A stackable package has a frame substrate. A stacked package assembly includes a second package mounted on a first package using peripheral solder ball z-interconnect, in which the first package includes a die enclosed by a mold cap and in which the second package includes one die mounted on the frame substrate.

16 Claims, 4 Drawing Sheets

U.S. PATENT DOCUMENTS

| | | |
|---|---|---|
| 2004/0212069 A1 | 10/2004 | Chen et al. |
| 2005/0098868 A1 | 5/2005 | Chang et al. |
| 2005/0230799 A1 | 10/2005 | Kang |
| 2006/0131715 A1 | 6/2006 | Satou et al. |
| 2006/0131740 A1 | 6/2006 | Kawabata et al. |
| 2006/0157843 A1 | 7/2006 | Hwang |
| 2006/0170092 A1 | 8/2006 | Kim et al. |
| 2006/0175695 A1 | 8/2006 | Lee |
| 2006/0175696 A1 | 8/2006 | Kim |
| 2006/0180911 A1 | 8/2006 | Jeong et al. |
| 2006/0202318 A1 | 9/2006 | Satou et al. |
| 2006/0205119 A1 | 9/2006 | Appelt et al. |
| 2006/0289989 A1 | 12/2006 | Yee et al. |
| 2007/0001286 A1 | 1/2007 | Chiu et al. |
| 2007/0215380 A1 | 9/2007 | Shibamoto |
| 2007/0216008 A1 | 9/2007 | Gerber |
| 2008/0023816 A1 | 1/2008 | Weng et al. |
| 2008/0048303 A1 | 2/2008 | Amagai et al. |
| 2008/0088001 A1 | 4/2008 | Kim et al. |
| 2009/0243072 A1* | 10/2009 | Ha et al. .................. 257/686 |

FOREIGN PATENT DOCUMENTS

| | | |
|---|---|---|
| JP | 09-082841 A | 3/1997 |
| JP | 10-070233 A | 3/1998 |
| JP | 2004-134478 A | 4/2004 |
| TW | 338185 | 8/1998 |
| TW | 396571 | 7/2000 |
| TW | 478136 | 3/2002 |
| TW | 556965 | 10/2003 |

OTHER PUBLICATIONS

Search Report for Taiwanese Patent Application No. 095119408.

* cited by examiner

STACKED SEMICONDUCTOR PACKAGE ASSEMBLY HAVING HOLLOWED SUBSTRATE

CROSS-REFERENCE TO RELATED APPLICATION(S)

This application is a Continuation of U.S. Non-Provisional application Ser. No. 11/420,873, filed May 30, 2006, now U.S. Pat. No. 7,528,474, which claims priority from U.S. Provisional Application No. 60/686,283, filed May 31, 2005, which is hereby incorporated by reference herein.

BACKGROUND ART

This invention relates to semiconductor packaging.

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips.

In one approach to increase functionality and performance in packages, integration is implemented on the "z-axis," that is, by stacking chips, and stacks of up to seven chips in one package have been used. This provides a dense chip structure having the footprint of a one-chip package, and obtaining thicknesses that have been continuously decreasing. The cost of a stacked die package is only incrementally higher than the cost of a single die package and the assembly yields are high enough to assure a competitive final cost as compared to packaging the die in individual packages.

A practical limitation to the number of chips that can be stacked in a stacked die package is the low final test yield of the stacked-die package. Inevitably some of the die in the package will be defective to some extent, and therefore the final package test yield will be the product of the individual die test yields, each of which is always less than 100%. This can be particularly a problem even if only two die are stacked in a package but one of them has low yield because of design complexity or technology.

Another approach to integrating on the "z-axis" is to stack die packages to form a multi-package module. Stacked packages can provide numerous advantages as compared to stacked-die packages. Examples of conventional stacked ball grid array packages are described, for example, in the background of U.S. Pat. No. 7,064,426.

For instance, each package with its die can be electrically tested, and rejected unless it shows satisfactory performance, before the packages are stacked. As a result the final stacked multi-package module yields are maximized.

Each die or more than one die can be packaged in a respective package in the stack using the most efficient first level interconnect technology for the chip type and configuration, such as wire bonding or flip chip, to maximize performance and minimize cost.

The z-interconnect between packages in a stacked multi-package module is a critical technology from the standpoint of manufacturability, design flexibility and cost. Z-interconnects that have been proposed include peripheral solder ball connection. The use of peripheral solder balls for z-interconnects in stacked multi-package modules limits the number of connections that can be made and limits design flexibility, and results in a thicker and higher cost package.

FIG. 1 is a diagrammatic sketch in a sectional view illustrating the structure of an example of a conventional multi-package module, generally known as a "package-on-package" assembly, in which z-interconnection between the stacked packages is made by solder balls. A first package (the "bottom" package) in this example may be a conventional ball grid array package, including a die mounted upon a die attach surface of a "bottom" package substrate 12 using a die attach adhesive. The bottom package substrate has at least one metal layer (two are shown in the example illustrated in FIG. 1). The bottom package die is electrically connected to the bottom substrate by wire bonds, and the bottom package die and the wire bonds are enclosed in a mold cap. The bottom package substrate is electrically interconnected to circuitry, such as for example, a motherboard (not shown) in the device in which the package is deployed, in this example by second-level interconnect solder balls 18. A second package (the "top" package) in this example includes two die mounted one over the other and affixed upon a "top" package substrate 14 using a die attach adhesive. The bottom package substrate has at least one metal layer (two are shown in the example illustrated in FIG. 1). The top package die are electrically interconnected to the top substrate by wire bonds, and the die attach surface of the top substrate and all the structures mounted upon it are encapsulated. Thus in this example the top package is stacked on the bottom package and is similar in structure to the bottom package, except that the z-interconnect solder balls 16 in the top package are arranged at the periphery of the top package substrate 14, so that they effect the z-interconnect without interference of the top package substrate with the mold cap of the bottom package.

Solder masks are patterned over the metal layers at the surfaces of the substrates 12, 14 to expose the underlying metal at bonding sites for electrical connection, for example the wire bond sites and bonding pads for bonding the wire bonds and solder balls.

The z-interconnection in the package-on-package module of FIG. 1 is achieved by reflowing the solder balls 16 attached to peripheral bonding pads on the lower metal layer of the top package substrate 14 onto peripheral bonding pads on the upper metal layer of the bottom package substrate 12. In this configuration the distance h between the top and bottom packages must be at least as great as the mold cap height of the bottom package, which (depending among other factors upon the thickness of the bottom package die and the flow characteristics of the molding material) may be 0.3 mm or more, and typically is in a range between 0.5 mm and 1.5 mm or more. The z-interconnect solder balls 16 must accordingly be of a sufficiently large diameter that when they are reflowed they make good contact with the bonding pads of the bottom substrate; that is, the z-interconnect solder ball diameter must be greater than the encapsulation height. A larger ball diameter dictates a larger ball pitch, which in turn limits the number of balls that can be fitted in the available space, limiting the number of z-interconnections that can be made between the packages. A greater number of balls at a given pitch can be accommodated by adding additional rows of balls; but this requires dedicating additional substrate area to the z-interconnection, and for a given bottom package die size this results in an increase in package footprint. The problem is exacerbated where the bottom package includes two or more stacked die, as additional die add to the overall mold cap thickness. For some bottom package configurations, a conventional package-on-package configuration using peripheral solder ball z-interconnection may be impracticable.

DISCLOSURE OF THE INVENTION

This invention is directed to stackable semiconductor packages having a "hollowed" substrate; that is, the substrate is provided with an opening dimensioned to accommodate but not contact a mold cap in a bottom package on which the stackable package is to be mounted using peripheral solder ball z-interconnect.

In one general aspect the invention features a stackable package substrate having a generally centrally-located opening shaped and dimensioned to accommodate but not contact a mold cap of a package upon which the stackable package is to be mounted. Accordingly, the substrate has the form of a frame surrounding an opening. On the die attach surface the frame substrate accommodates a marginal die attach margin adjacent at least part of the edge of the opening; and at least one row of wire bond sites arranged or arrayed in two or more rows generally parallel to at least one outer frame edge, for electrical interconnection of die mounted on the frame. On the surface opposite the die attach surface, the frame substrate accommodates at least one row of z-interconnect ball pads arranged or arrayed to align with corresponding z-interconnect pads on the substrate of a package on which the stackable package is to be mounted.

In another general aspect the invention features a stackable package having such a frame substrate.

In another general aspect the invention features a stacked package assembly including a second package mounted on a first package using peripheral solder ball z-interconnect. The first package (which may be referred to as the "bottom" package) includes at least one die affixed to a die attach surface of a first package substrate, in which the die is enclosed by a mold cap. The second package (which may be referred to as the "top" package) includes at least one die mounted on a frame substrate. The frame substrate has the form of a frame surrounding an opening. On the die attach surface the frame substrate accommodates a marginal die attach margin adjacent at least part of the edge of the opening; and at least one row of wire bond sites arranged or arrayed generally parallel to at least one outer frame edge, for electrical interconnection of die mounted on the frame. On the surface opposite the die attach surface, the frame substrate accommodates at least one row of z-interconnect ball pads arranged or arrayed to align with corresponding z-interconnect pads on the substrate of a package on which the stackable package is to be mounted. The opening in the substrate is shaped and dimensioned to accommodate but not contact the mold cap on the bottom package when the packages are mounted; that is, in the assembly the mold cap protrudes into the space made available within the opening in the frame substrate.

In some embodiments the opening is generally rectangular, for example generally square, to accommodate a generally rectangular or square mold cap. The opening must be at least large enough to admit the protruding mold cap when the z-interconnection has been completed. In some embodiments the opening is at least as large as the footprint of the mold cap, where the mold cap meets the lower package substrate surface; in some embodiments, where the mold cap has slanting sides, the opening can be somewhat smaller than the mold cap footprint, having dimensions in a range between the size of the mold cap footprint and the size of the upper surface of the mold cap.

In some embodiments the first (bottom) package is a ball grid array package, having one or more die mounted onto and interconnected with the first package substrate by wire bonding, or having one or more die mounted onto the substrate by flip chip interconnection.

In another general aspect the invention features a method for making a stacked package-on-package assembly, by: providing a molded first package having peripheral z-interconnect solder ball pads in a row or an array on the surface on which the die and mold cap are formed; providing a stackable second package, by providing a frame substrate having a die attach side and an opposite side and an opening shaped and dimensioned to accommodate but not contact the mold cap and having z-interconnect solder ball pads in a row or an array on the opposite side, mounting at least one die on a die attach side of the frame substrate and electrically interconnecting the die onto the die attach side of the substrate by wire bonds, encapsulating the die and interconnects on the die attach side of the frame substrate, and mounting z-interconnection solder balls on the solder ball pads on the opposite side; aligning the second package with the first package so that the z-interconnect solder balls on the second package are aligned with respective solder ball pads on the first package, and contacting the solder balls with the ball pads and reflowing to complete the mount and electrical interconnection of the first and second package substrates. In some embodiments the assembly can be overmolded.

BEST MODE FOR CARRYING OUT THE INVENTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly named, although they are all readily identifiable in all the FIGS.

Figure 2:
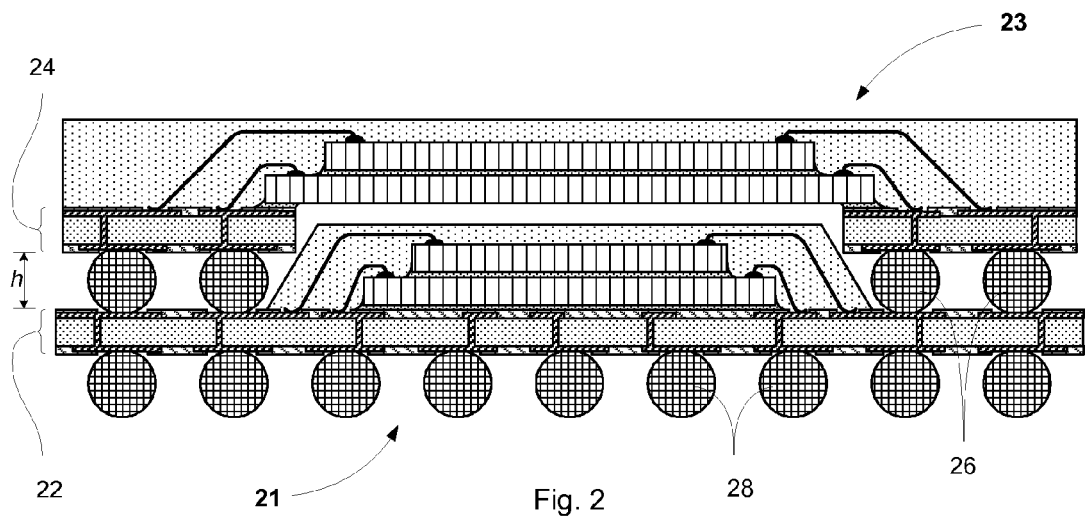
FIG. 2 is a diagrammatic sketch in a sectional view showing an example of a package-on-package assembly according to one aspect of the invention, in which an opening through the top package substrate is dimensioned to accommodate the mold cap in a stacked die bottom package.

Turning now to FIG. 2, there is shown in a diagrammatic sectional view an example of a stacked package assembly according to an aspect of the invention.

In this example the first ("Bottom") package 21 is a molded stacked die ball grid array package. It includes two die, a lower one mounted upon a die attach surface of the "bottom" package substrate 22, and an upper one mounted upon the lower one. The bottom package substrate in this example has two metal layers, one on each side of a dielectric layer. The metal layers are connected by vias. A solder mask overlies each of the metal layers, and is patterned to expose sites on the metal layers for electrical connection, such as wire bond sites and solder ball pads. The die are mounted using a die attach adhesive, such as a die attach epoxy or a film adhesive. The die are electrically interconnected to the bottom substrate 22 by wire bonds connecting pads on the die to sites exposed on the metal layer in the die attach surface of the bottom substrate, and the die and the wire bonds are enclosed by encapsulation in a mold cap. A standard ball grid array package is described, for example, in the background of U.S. Pat. No. 7,064,426.

In the embodiment of the invention of FIG. 2 the "top" package 23 has two die on a "frame" substrate 24. That is, the top package substrate 24 has the form of a frame surrounding an opening, which is shown in sectional and plan views in FIGS. 4A and 4B. On the die attach surface (at the "upper" side) the frame substrate accommodates a marginal die attach region adjacent at least part of the edge of the opening; and at least one row of wire bond sites arranged or arrayed along at least one outer frame edge, for electrical interconnection of die mounted on the frame. In this example the opening is generally square, dimensioned to accommodate but not contact a generally square bottom package mold cap, when the packages are mounted; that is, in the assembly the mold cap protrudes into the space made available within the opening in the frame substrate with an empty gap between the mold cap and the frame substrate. Also in this example the die attach region includes the margins on all four sides of the square opening. The first die is affixed using a die attach adhesive to the margin of the opening, within the area indicated by the broken line 46 shown in FIG. 4B. The second die is affixed to the first die, using a die attach adhesive, and the die are interconnected to the top substrate 24 by wire bonds connecting pads on the die to sites exposed on the metal layer in the die attach surface of the top substrate. On the surface opposite the die attach surface, the frame substrate 24 accommodates at least one row of z-interconnect ball pads arranged or arrayed to align with corresponding z-interconnect pads on the substrate of the bottom package. Z-interconnect solder balls 26 are mounted on the ball pads, and then reflowed to form the interconnection between the top 24 and bottom 22 substrates. Second level interconnect solder balls 28 are attached to second level interconnect sites on the lower ("land") side of the bottom substrate 22 for interconnection of the assembly to underlying circuitry, such as a motherboard.

Figure 4A:
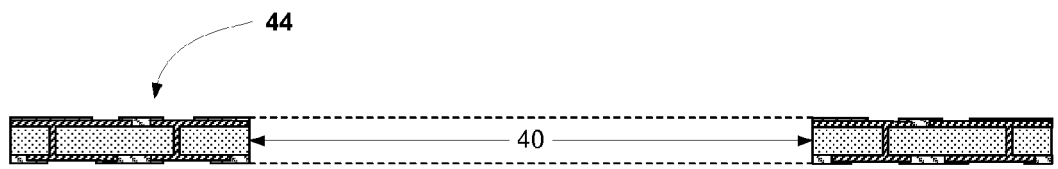
FIG. 4A is a diagrammatic sketch in a sectional view showing a stackable package substrate according to one aspect the invention, having an opening therethrough to accommodate a mold cap of a package upon which the stackable package is to be mounted by peripheral solder balls.
Figure 4B:
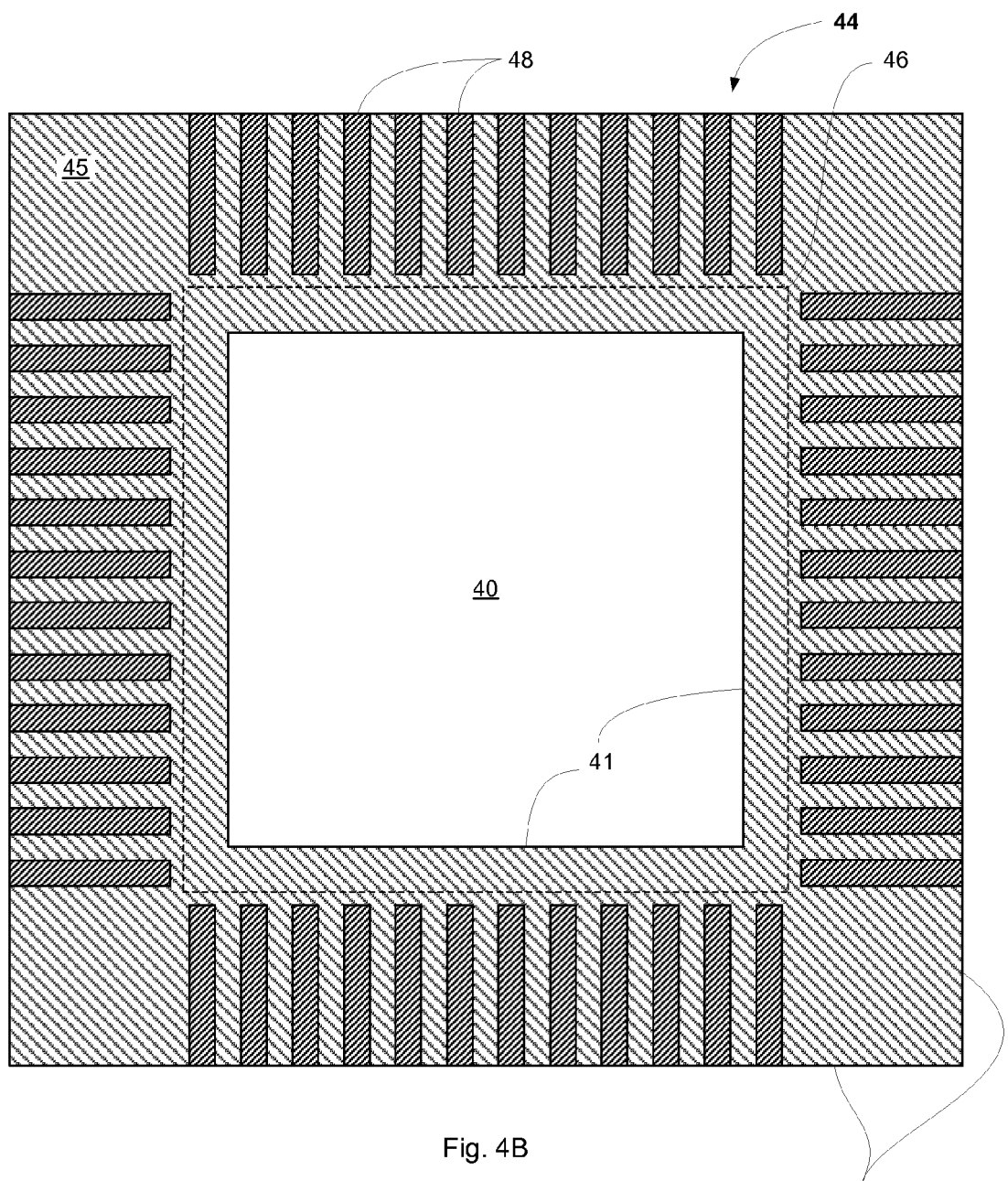
FIG. 4B is a diagrammatic sketch in a plan view showing a substrate as in FIG. 4A.

Referring now particularly to FIGS. 4A and 4B, a frame substrate 44 is shown, having an opening 40. The frame substrate has a die attach ("upper") side 45 which is provided with peripherally arranged bond fingers 48, which in this example are adjacent the outer edges 43 of the substrate 44. A die attach region, defined in FIG. 4B by broken line 46, is situated at an inner margin of the frame substrate 44, adjacent the edges 41 of the opening 40 in the frame substrate 44.

As FIG. 2 shows, in the assembly according to the invention, the bottom package mold cap protrudes into the opening in the frame substrate. The solder balls are of a size sufficient to provide clearance between the top of the mold cap and the underside of the first die on the top package at the opening; and the opening is dimensioned so that there is clearance between the edges of the opening and the mold cap. In some embodiments (see for example FIG. 6) the assembly is over-molded, and in such embodiments sufficient distance must be provided between the mold cap and the die, and between the mold cap and the edges of the opening, to allow flow of the molding compound during the encapsulation process.

Figure 1:
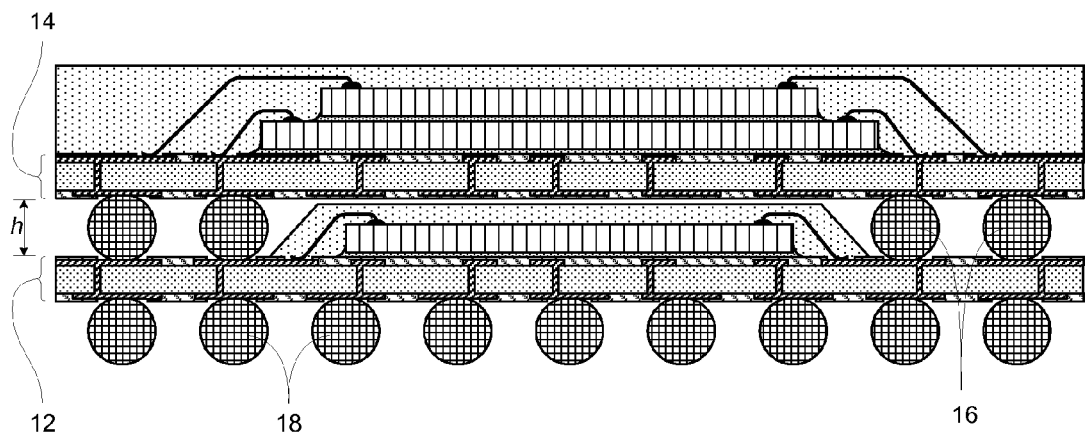
FIG. 1 is a diagrammatic sketch in a sectional view showing a conventional "package-on-package" multipackage module having z-interconnection by peripheral solder balls between the package substrates.

Also as FIG. 2 shows, in this example the z-level interconnect solder balls are sized to provide a distance h between the top and bottom packages, as in the conventional package of FIG. 1. Because according to the invention the top package substrate is a frame substrate, a much thicker mold cap (covering two stacked die, in this example) is accommodated in the example of FIG. 2 than can be accommodated in a conventional package-on-package module. This provides for increased semiconductor device density in the bottom package in the assembly.

Once the assembly is formed, and the z-interconnection is complete, as shown in FIG. 2, the second-level interconnect balls 28 are mounted on the solder ball pads on the underside of the first package substrate, for interconnection of the assembly with circuitry (such as a motherboard; not shown) in the device in which the assembly is deployed.

Figure 3:
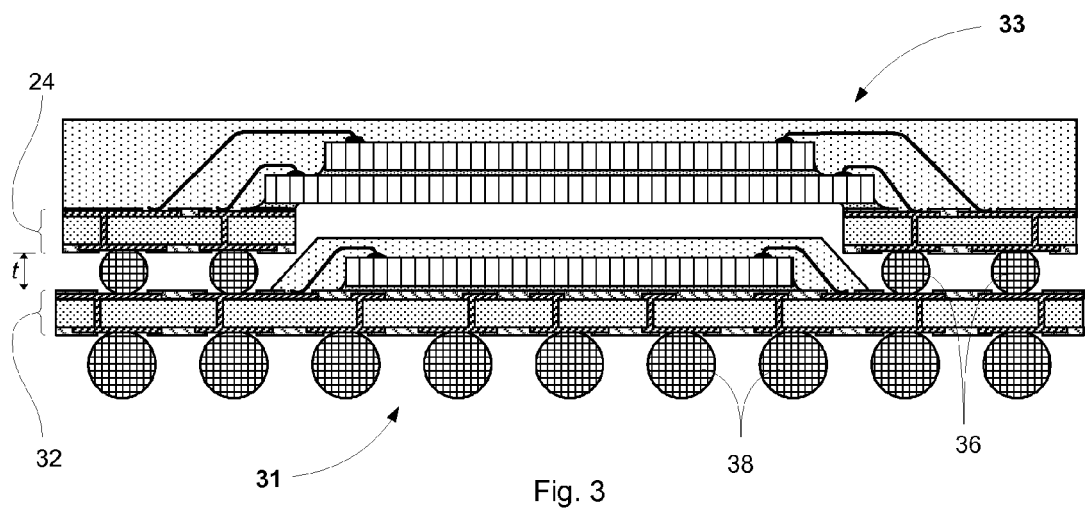
FIG. 3 is a diagrammatic sketch in a sectional view showing an example of a package-on-package assembly according to one aspect of the invention, in which an opening through the top package substrate is dimensioned to accommodate the mold cap in a bottom package, permitting the use of smaller diameter z-interconnect balls.

An example of another embodiment of the invention is shown in FIG. 3. In this embodiment, the bottom package 31 has a single die, and the mold cap has the same thickness as in the conventional package-on-package module shown for example in FIG. 1. Here, however, because according to the invention the top package substrate 24 is a frame substrate, the mold cap can be accommodated within the opening. The distance t between the top and bottom substrates can accordingly be made less than that (h) in the conventional package-on-package assembly. This makes possible the use of smaller z-interconnect solder balls 36. The use of smaller z-interconnect balls, in turn, permits a smaller ball pitch, enabling the use of a denser interconnection routing, and thereby providing a greater number of interconnections between the packages than in the conventional assembly, without requiring dedication of any additional substrate area to interconnection (or, in some designs, requiring dedication of less substrate area to interconnection). Second level interconnect solder balls 38 are attached to second level interconnect sites on the lower ("land") side of the bottom substrate 32 for interconnection of the assembly to underlying circuitry, such as a motherboard.

Figure 5A:
FIGS. 5A through 5F are diagrammatic sketches in sectional view showing stages in the construction of a stackable top package according to one aspect of the invention.
Figure 5B:
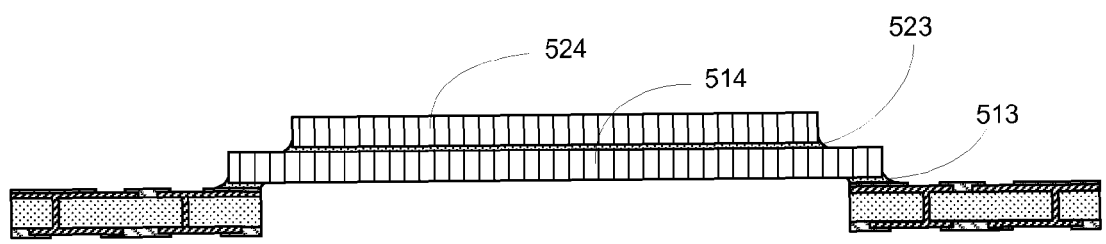
Figure 5C:
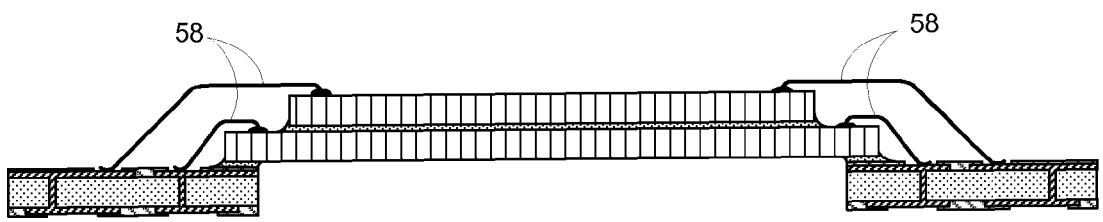
Figure 5D:
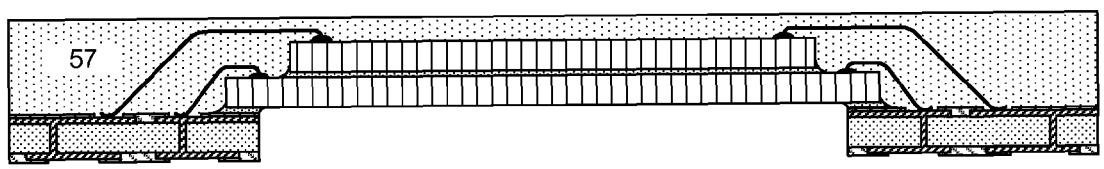
Figure 5E:
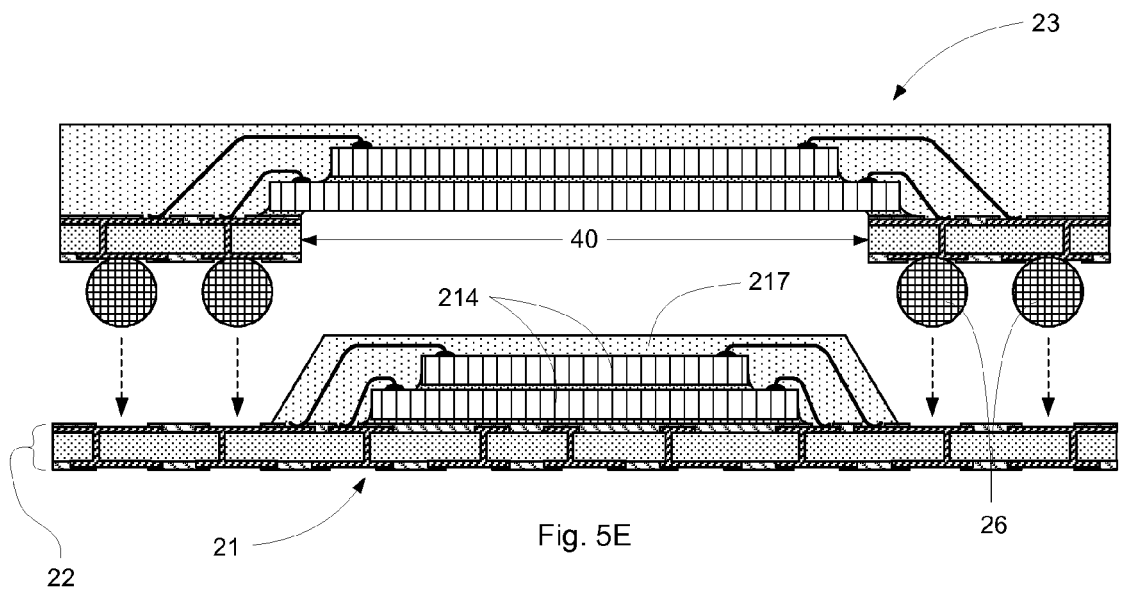
Figure 5F:
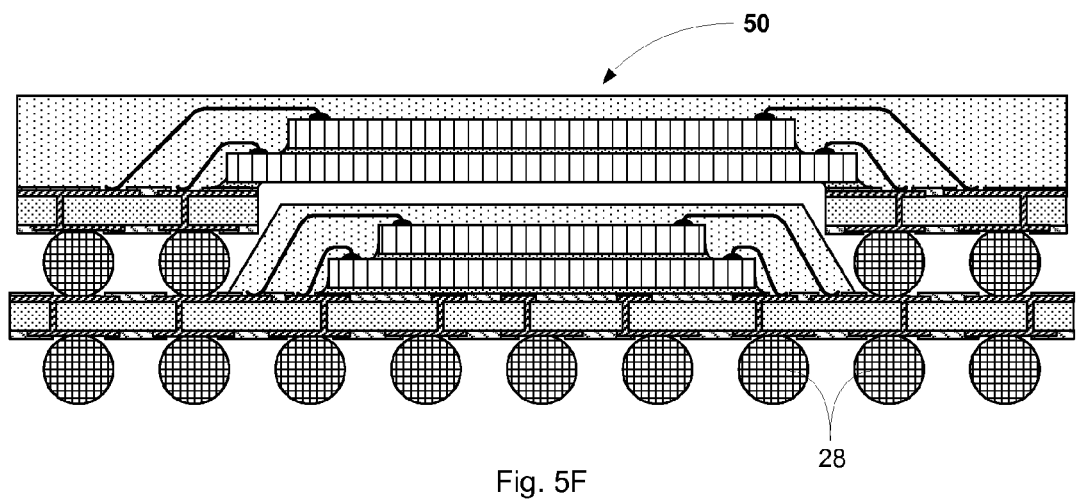

The top package according to the invention can be made generally in stages as shown for example in FIGS. 5A through 5E, and an assembly according to the invention can be made as shown for example in FIGS. 5E, 5F and 5G. FIG. 5A shows a top substrate frame 44, which can be made from conventional substrate materials in which the metal layers are suitably patterned, and the opening can be punched or sawn using conventional tools. The substrate in the examples shown here has two metal layers with a dielectric layer between, and the metal layers are connected by vias through the dielectric layer. Other substrate types may be used for the top substrate, including for example: a laminate with 2-6 metal layers, or a build up substrate with 4-8 metal layers, or a flexible polyimide tape with 1-2 metal layers, or a ceramic multilayer substrate. Generally, the substrate can be constructed by conventional methods of patterning and build-up, in which the design of the metal layer[s] takes account of the opening; and the opening can be made by sawing or punching. Usually, the substrate is formed as a row or array of substrates in a strip, from which the individual packages are saw- or punch-singulated at some stage of completion.

A first die 514 is mounted using a die attach adhesive 513 onto the die attach region at the margin of the edge of the opening of the frame substrate, as shown in FIG. 5B. The die is mounted active-side upward. In some embodiments the die is attached to the margins adjacent the entire edge (or all the edges) of the opening. The die may in other embodiments be narrower in one dimension than the opening, and in such embodiments, the die may be attached to margins adjacent the edges at only part of the opening, as for example at opposite edges of a generally rectangular or square opening. A second die 524 is mounted active side upward using a die attach adhesive 523 onto the upward-facing active surface of the first die. The first and second die are connected to the frame substrate by wire bonds 58 between pads on the die and wire bond sites exposed in the patterned solder mask over the metal layer on the upper side of the top substrate, as shown in FIG. 5C, and the die attach surface of the top frame substrate and all the features mounted on the die attach surface, including the die and wires, are encapsulated using an encapsulation material 57, as shown in FIG. 5D. Then the z-interconnect solder balls 26 are mounted on the solder ball pads on the opposite side of the top frame substrate to make the top stackable package 23 shown in FIG. 5E.

The top stackable package is then aligned with a bottom molded package 22, as shown in FIG. 5E, and the two packages are moved together, as shown by the broken arrows in FIG. 5E, to bring the z-interconnect solder balls on the top package into contact with the corresponding Z-interconnect solder ball pads on the die attach surface of the bottom package. Then the solder balls are reflowed to complete the interconnection, forming the assembly 50 shown in FIG. 5F.

In the example shown by way of example in FIG. 5E, the bottom package 21 is a stacked die package, having first and second die 214 mounted over the bottom package substrate 22 and interconnected with the bottom package substrate by wire bonds. The bottom package is molded to form a mold cap 217. Other molded bottom package configurations are contemplated by the invention; for example, the bottom package may have only one die, or more than two die; and, for example, at least one die in the bottom package may be a flip chip die.

As may be appreciated, the assembly may be formed up to a stage as shown in FIG. 5F, but omitting the second-level interconnection balls 28. The interconnection of the module to another device, or to circuitry in the device in which the module is to be deployed, can be made by means other than solder ball interconnections; pads or wire bonds may be employed, for example, depending upon the environment of the end use.

In practice, both the top and the bottom packages can be formed in a row or array, beginning with a row or array substrate strip. Top packages according to the invention can be made beginning with a row or array substrate strip, and can be formed on the strip, up to the stage shown in FIG. 5C; then the entire row or array of packages can be encapsulated and the encapsulation hardened, and the individual packages can be saw-singulated. Bottom packages can be made beginning with a row or array substrate strip, up to and including a stage of cavity-molding to form the mold caps. The assembly of the top packages onto the bottom packages can then be carried out on the strip or array of bottom packages, and then the assemblies can be singulated by punching (for example) through the bottom substrate.

Figure 6:
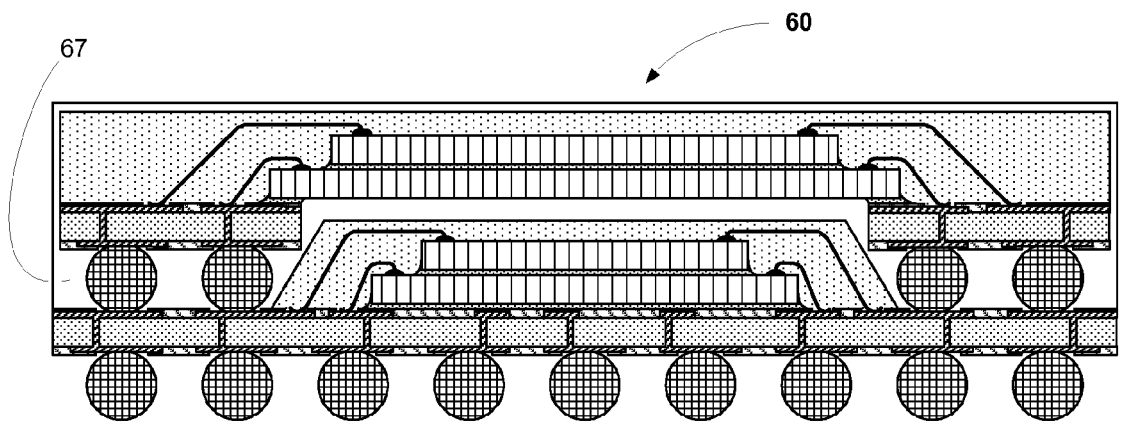
FIG. 6 is a diagrammatic sketch in a sectional view showing an example of a package-on-package assembly according to one aspect of the invention, similar to the example illustrated in FIG. 2, having overmolding.

In some embodiments the assembly is overmolded; that is, a molding compound or encapsulation material 67 is applied to fill the spaces between the top and bottom packages, and also in a thin layer at the sides and top of the top package, to form the overmolded module 60 shown for example in FIG. 6.

Where an overmolded module is desired and where the assemblies are formed in strip or array form, the encapsulation can be completed by encapsulating the entire strip or array of assemblies, and then saw singulating to obtain the individual modules as shown in FIG. 6.

The multi-package module of the invention can be employed in any of a diverse variety of applications, such as, for example, computers, portable communications devices, consumer products.

All patents and patent application referenced herein are hereby incorporated herein by reference.

What is claimed is:

1. A stacked package assembly, comprising a second package mounted on a first package using peripheral solder ball z-interconnect, wherein the first package comprises at least one first package die affixed to a die attach surface of a first package substrate, the first package die being enclosed by a mold cap, and wherein the second package comprises at least one second package die mounted on a die attach side of a frame substrate, the frame substrate having the form of a frame surrounding an opening, the opening being shaped and dimensioned to accommodate but not contact the mold cap on the bottom package when the packages are mounted with a gap between the mold cap and the frame substrate.

2. The stacked package assembly of claim 1 wherein the frame substrate comprises on the die attach side a marginal die attach margin adjacent at least part of the edge of the opening.

3. The stacked package assembly of claim 1 wherein the frame substrate comprises on the die attach side at least one row of wire bond sites along at least one outer frame edge, for electrical interconnection of the second package die.

4. The stacked package assembly of claim 1 wherein the frame substrate comprises on the side opposite the die attach side a plurality of z-interconnect ball pads arranged to align with corresponding z-interconnect pads on the substrate of the first package.

5. The stacked package assembly of claim 1 wherein the opening in the frame substrate is shaped and dimensioned to accommodate but not contact the mold cap on the bottom package when the packages are mounted.

6. The stacked package assembly of claim 1 wherein the mold cap protrudes into the space within the opening in the frame substrate.

7. The stacked package of claim 1 wherein the opening is generally rectangular.

8. The stacked package of claim 7 wherein the opening is generally square.

9. The stacked package of claim 1 wherein the opening is at least as large as a footprint of the mold cap.

10. The stacked package of claim 1 wherein the opening is at least as large as a surface of the mold cap.

11. The stacked package of claim 1 wherein a footprint of the mold cap is larger than a surface of the mold cap, and wherein the opening has dimensions in a range between the size of the mold cap footprint and the size of the upper surface of the mold cap.

12. The stacked package of claim 1 wherein the first package is a ball grid array package.

13. The stacked package of claim 1 wherein the first package comprises at least one die mounted onto and interconnected with the first package substrate by wire bonding.

14. The stacked package of claim 1 wherein the first package comprises at least one die mounted onto and interconnected to the first package substrate.

15. A method for making a stackable semiconductor package, comprising:

providing a frame substrate having a die attach side and an opposite surface and an opening shaped and dimensioned to accommodate but not contact a mold cap mounted with an empty gap between the mold cap and the frame substrate and having z-interconnect solder ball pads in a row or an array on the opposite side; and mounting at least one die on a die attach region of the die attach side of the frame substrate and electrically interconnecting the die onto the die attach side of the substrate by wire bonds, encapsulating the die and interconnects on the die attach side of the frame substrate, and mounting z-interconnection solder balls on the solder ball pads on the opposite surface.

16. A method for making a stacked package assembly, comprising:

providing a molded first package including a die mounted on a mold cap side of a first package substrate, the first package substrate having peripheral z-interconnect solder ball pads on the mold cap side;

providing a stackable second package made as in claim 15;

mounting z-interconnection solder balls on the solder ball pads on the opposite side of the frame substrate;

aligning the second package with the first package so that the z-interconnect solder balls on the second package are aligned with respective solder ball pads on the first package; and contacting the solder balls with the ball pads and reflowing to complete the mount and electrical interconnection of the first and second package substrates.

* * * * *